(12) United States Patent
Horiuchi et al.

(10) Patent No.: US 11,211,881 B2
(45) Date of Patent: Dec. 28, 2021

(54) POWER CONVERSION DEVICE AND ELECTRIC RAILROAD VEHICLE EQUIPPED WITH POWER CONVERSION DEVICE

(71) Applicant: HITACHI, LTD., Tokyo (JP)

(72) Inventors: Keisuke Horiuchi, Tokyo (JP); Kiyoshi Nakata, Tokyo (JP); Noriyoshi Urushiwara, Tokyo (JP); Shuichi Terakado, Tokyo (JP); Kiyoshi Terasawa, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 16/962,308

(22) PCT Filed: Oct. 15, 2018

(86) PCT No.: PCT/JP2018/038329
§ 371 (c)(1),
(2) Date: Jul. 15, 2020

(87) PCT Pub. No.: WO2019/146179
PCT Pub. Date: Aug. 1, 2019

(65) Prior Publication Data
US 2021/0075342 A1 Mar. 11, 2021

(30) Foreign Application Priority Data
Jan. 26, 2018 (JP) .............................. JP2018-011887

(51) Int. Cl.
*H02M 7/5387* (2007.01)
*B60L 9/18* (2006.01)
(Continued)

(52) U.S. Cl.
CPC .......... *H02M 7/53871* (2013.01); *B60L 9/18* (2013.01); *B60L 9/24* (2013.01); *H02M 1/32* (2013.01);
(Continued)

(58) Field of Classification Search
CPC ..... H02M 7/53871; H02M 7/003; H02M 1/32
See application file for complete search history.

(56) References Cited

U.S. PATENT DOCUMENTS

2006/0274561 A1* 12/2006 Ahmed ............. H02M 7/53871
363/132
2008/0186751 A1* 8/2008 Tokuyama ............ H02M 7/537
363/131
(Continued)

FOREIGN PATENT DOCUMENTS

EP 2848452 A2 3/2015
EP 2894057 A1 7/2015
(Continued)

OTHER PUBLICATIONS

International Search Report and Written Opinion of PCT/JP2018/038329 dated Dec. 25, 2018.
(Continued)

*Primary Examiner* — Daniel Kessie
(74) *Attorney, Agent, or Firm* — Mattingly & Malur, PC (57) ABSTRACT

A power conversion device achieves size reduction and reliability by reducing the number of components of the system. The power conversion device has a semiconductor module of a half-bridge configuration in which two semiconductor elements are arranged in series. The semiconductor module has a cuboidal shape and has, along a longitudinal direction thereof, a positive pole terminal, a negative pole terminal, and terminals for inputting or outputting alternating current or for forming a single phase of the power
(Continued)

conversion device. In the vertical direction corresponding to a widthwise direction of the cuboid, a plurality of the semiconductor modules are arranged vertically, forming a plurality of phases of the power conversion device. The semiconductor modules of the plurality of phases are installed in contact with a cooling unit, and one or more capacitors are disposed so as to face the cooling unit across the semiconductor modules of the plurality of phases.

10 Claims, 12 Drawing Sheets

(51) Int. Cl.
*B60L 9/24* (2006.01)
*H02M 1/32* (2007.01)
*H02M 5/458* (2006.01)
*H02M 7/00* (2006.01)
*H05K 7/20* (2006.01)
*H05K 7/10* (2006.01)

(52) U.S. Cl.
CPC ......... *H02M 5/4585* (2013.01); *H02M 7/003* (2013.01); *H05K 7/20909* (2013.01); *B60L 2200/26* (2013.01); *H05K 7/10* (2013.01)

(56) References Cited

U.S. PATENT DOCUMENTS

| | | | |
|---|---|---|---|
| 2008/0225487 A1* | 9/2008 | Nakajima | H02M 7/003 361/699 |
| 2012/0250384 A1* | 10/2012 | Ito | H02K 5/225 363/132 |
| 2016/0226396 A1* | 8/2016 | Hattori | H05K 7/1432 |
| 2017/0099010 A1* | 4/2017 | Dziuba | H02M 7/003 |
| 2017/0302153 A1* | 10/2017 | Mochiki | B60L 15/007 |
| 2019/0019785 A1* | 1/2019 | Nakashima | H02M 5/4585 |
| 2020/0176168 A1* | 6/2020 | Tanabe | H01F 27/16 |

FOREIGN PATENT DOCUMENTS

| | | |
|---|---|---|
| GB | 2539761 A | 12/2012 |
| JP | 07-154974 A | 6/1995 |
| JP | 2014-014203 A | 1/2014 |
| JP | 2015-056993 A | 3/2015 |
| JP | 2015-133779 A | 7/2015 |
| JP | 2016-213946 A | 12/2016 |
| JP | 2017-017999 A | 1/2017 |
| JP | 2017-184613 A | 10/2017 |
| WO | 2005/028242 A1 | 3/2005 |

OTHER PUBLICATIONS

International Preliminary Report on Patentability (PCT Chapter II), issued in counterpart International Application No. PCT/JP2018/038329 dated Jan. 7, 2020.
Extended European Search Report received in corresponding European Application No. 18902193.4 dated Aug. 27, 2021.

* cited by examiner

POWER CONVERSION DEVICE AND ELECTRIC RAILROAD VEHICLE EQUIPPED WITH POWER CONVERSION DEVICE

TECHNICAL FIELD

The present invention relates to a power conversion device and an electric railroad vehicle equipped with the power conversion device.

BACKGROUND ART

A power conversion device used to control a motor for driving a vehicle such as an electric railroad vehicle is installed under the floor of the vehicle. However, it is necessary to mount many parts such as, for example, a power supply for air conditioning, in addition to the power conversion device, under the floor of the vehicle, and thus the power conversion device is required to be downsized.

On the other hand, in order to improve efficiency and to respond to installation environments, various circuits as shown below exist, and downsizing of each circuit has been attempted.

In a technique disclosed in Patent Literature 1, in order to reduce a loss caused by winding resistance by reducing a motor current while boosting a voltage applied to the motor, when a boosting circuit is provided in a power conversion device for a railroad vehicle, the size of equipment is prevented from increasing due to the boosting circuit.

In a technique disclosed in Patent Literature 2, even in the case where a capacitor voltage is raised due to a contact loss of a pantograph and a sudden change in load when a regenerative brake is applied, reliability can be improved by installing an overvoltage suppression circuit to prevent an overvoltage to a semiconductor element in a power conversion device.

In a technique disclosed in Patent Literature 3, a reactor and a brake resistor necessary for a brake chopper device that reduces wear of an air brake to obtain brake force by converting electric power generated by a motor into heat by the brake resistor are shared with other devices to realize downsizing by reducing the number of parts of necessary devices and to reduce a failure risk.

CITATION LIST

Patent Literature

[Patent Literature 1] Japanese Unexamined Patent Application Publication No. 2015-133779
[Patent Literature 2] Japanese Unexamined Patent Application Publication No. Hei 7-154974
[Patent Literature 3] Japanese Unexamined Patent Application Publication No. 2015-56993

SUMMARY OF INVENTION

Technical Problem

Although the power conversion device is optimized to suit each purpose in the technique disclosed in each of Patent Literatures 1 to 3, it is difficult to realize downsizing by reducing the number of parts as an entire system and to improve reliability on a route where these circuits are mixed.

Solution to Problem

In view of the above-described problems, the present invention provides a power conversion device configured using a semiconductor module having a half-bridge configuration in which two semiconductor elements are arranged in series, wherein the semiconductor module has a substantially cuboidal shape, forms one phase configuring the power conversion device by providing a positive-electrode terminal, a negative-electrode terminal, and a terminal for inputting or outputting module AC or for a specific purpose along the longitudinal direction of the cuboid, and forms plural phases configuring the power conversion device by vertically arranging the plural semiconductor modules in the vertical direction that is the short-length direction of the cuboid, wherein the semiconductor modules of the plural phases are installed while coming into contact with cooling equipment, and wherein one or more capacitors are arranged on the opposite side of the cooling equipment across the semiconductor modules of the plural phases.

Advantageous Effects of Invention

According to the present invention, a four-phase integrated power conversion device can be configured in such a manner that one phase is used for any one of a boosting circuit, an overvoltage suppression circuit, and a brake chopper circuit for a specific purpose and is combined with three phases configuring an inverter. Alternatively, in the case of an AC overhead contact line, a four-phase integrated power conversion device can be configured as a two-phase two-group converter.

As described above, all the circuits are integrated into four phases, or a combination of four-phase integrated power conversion devices is mounted, so that the number of individual necessary parts can be reduced, and the productivity of the power conversion device can be improved. In addition, downsizing by reducing the number of parts and a reduction in failure risk can be realized.

DESCRIPTION OF EMBODIMENTS

Hereinafter, first and second embodiments of a power conversion device according to the present invention will be described with reference to the drawings.

First Embodiment

Figure 1:
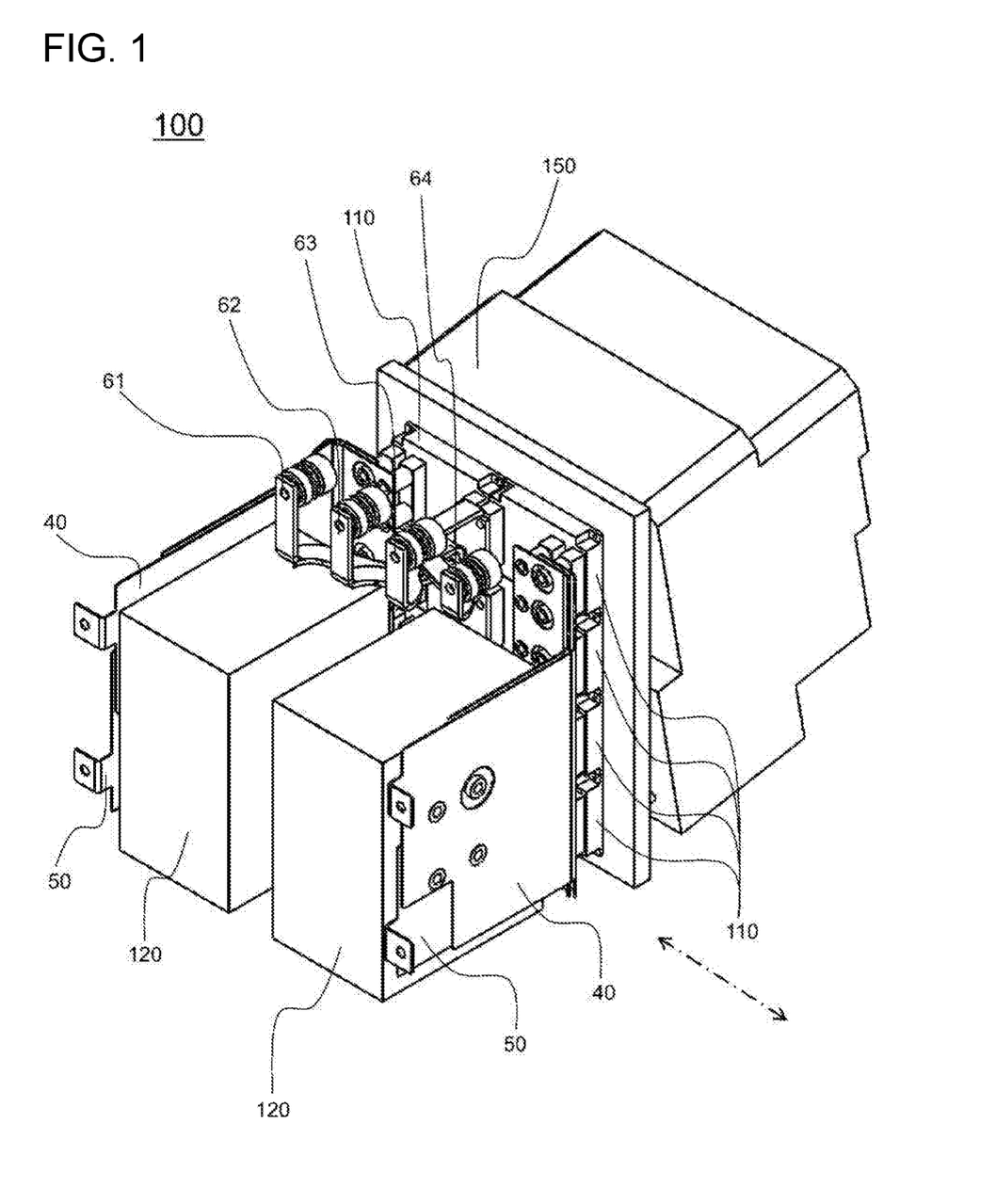
FIG. 1 is a diagram for showing a structure of a power conversion device according to a first embodiment of the present invention by using a perspective view.

FIG. 1 is a diagram for showing a structure of a power conversion device 100 according to the first embodiment of the present invention by using a perspective view.

The power conversion device 100 is configured using cooling equipment 150, plural power modules 110, plural capacitors 120, a positive-electrode bus bar 40, a negative-electrode bus bar 50, and bus bars 61 to 64 for outputting or inputting or for specific purposes. The plural power modules (2-in-1 power modules) 110 are installed while coming into contact with the cooling equipment 150, and four 2-in-1 power modules 110 are arranged on the cooling equipment 150 while aligning a module short-length direction 5 with the vertical direction (see also FIG. 3). In addition, the plural capacitors 120 are disposed on the opposite side of the cooling equipment 150 across the power modules 110.

Figure 4:
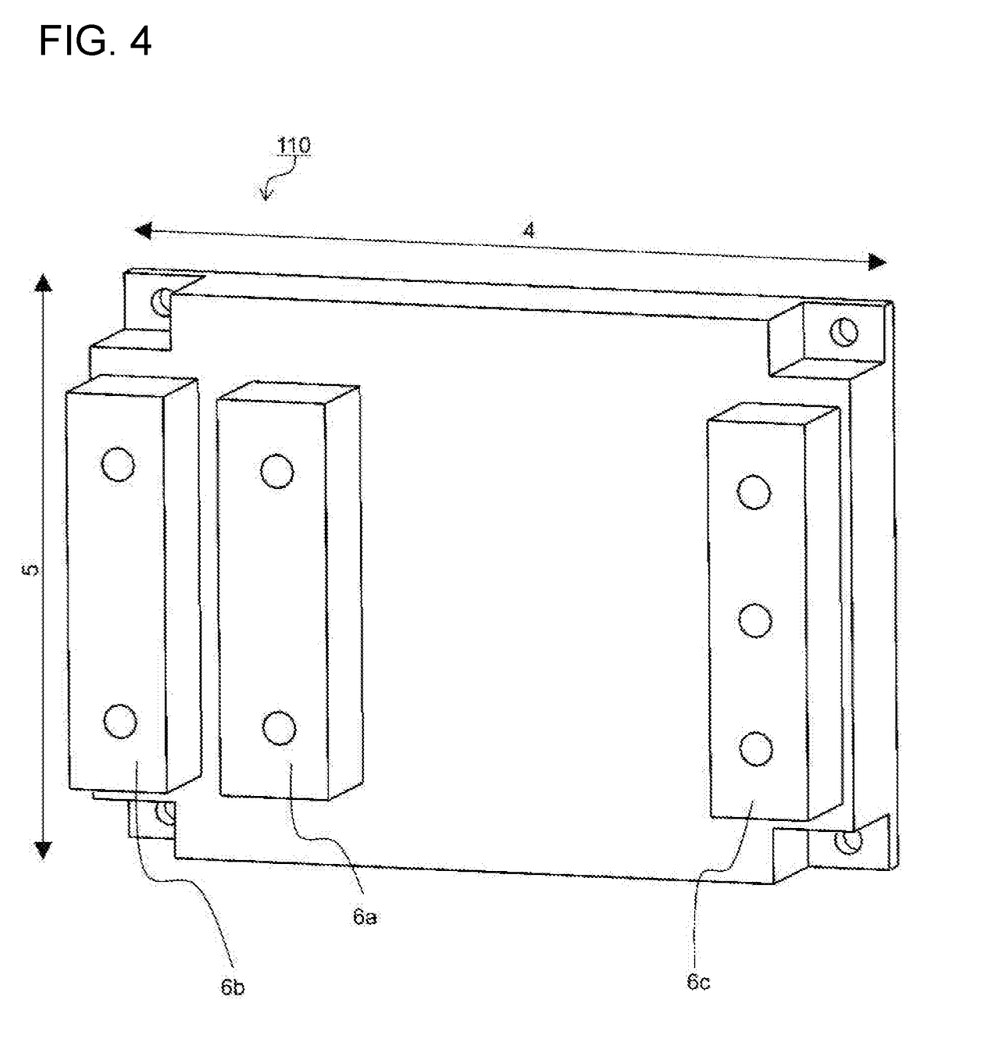
FIG. 4 is a diagram for showing a power module mounted to cooling equipment in FIGS. 1 to 3.

Here, a structure of a single 2-in-1 power module 110 is shown in FIG. 4. The 2-in-1 power module 110 has a substantially cuboidal shape, and a module positive-electrode terminal 6a, a module negative-electrode terminal 6b, and a terminal 6c for inputting or outputting module AC or for a specific purpose are provided on the short-side sides along a module longitudinal direction 4. In addition, a control signal line (not shown) can be extracted from space between the module positive-electrode terminal 6a and the terminal 6c for inputting or outputting module AC or for a specific purpose.

Figure 2:
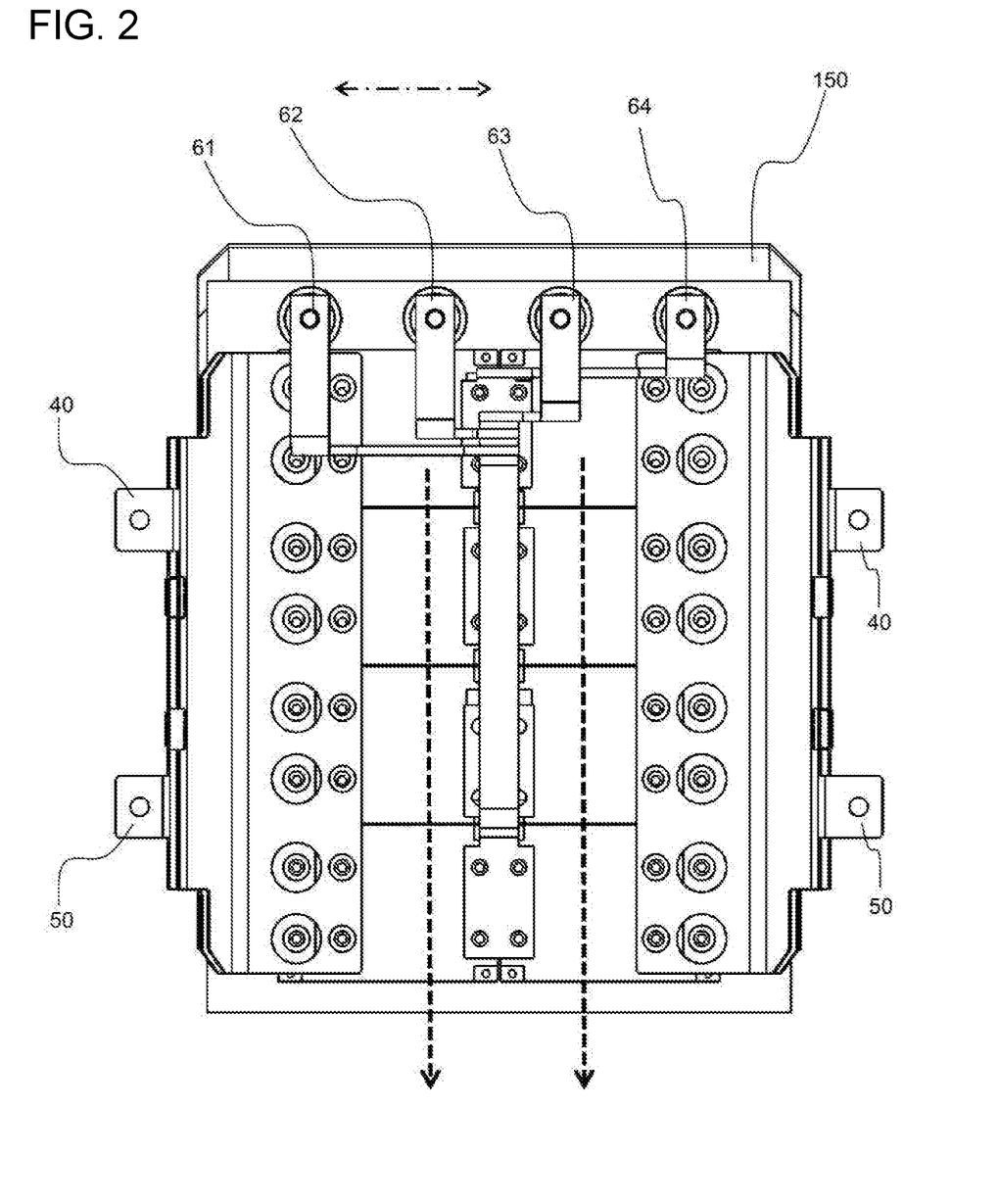
FIG. 2 is a front view in a state where only capacitors are dismounted from the structure of the power conversion device shown in FIG. 1.

FIG. 2 shows a front view in a state where only the capacitors 120 are dismounted from the structure of the power conversion device 100 shown in FIG. 1. As shown in the drawing, the positive-electrode bus bar 40 is connected to each module positive-electrode terminal 6a of each power module 110 (111 to 114), and the negative-electrode bus bar 50 is connected to each module negative-electrode terminal 6b of each power module 110 (111 to 114). In addition, the positive-electrode bus bars 40 and the negative-electrode bus bars 50 are located at both ends of the power conversion device 100 in the horizontal direction in a state where the dismounted capacitors 120 are sandwiched in the vertical direction, and are arranged in a plate shape in the vertical direction. Further, the bus bars 1 to 4 (61 to 64) for outputting or inputting or for specific purposes extend upward in the vertical direction along each terminal 6c for inputting or outputting module AC or for a specific purpose (see FIG. 3) of each power module 110 (111 to 114) located in the central part, and are connected to terminals 1 to 4 (71 to 74) for outputting or inputting or for specific purposes shown in FIG. 3.

Figure 3:
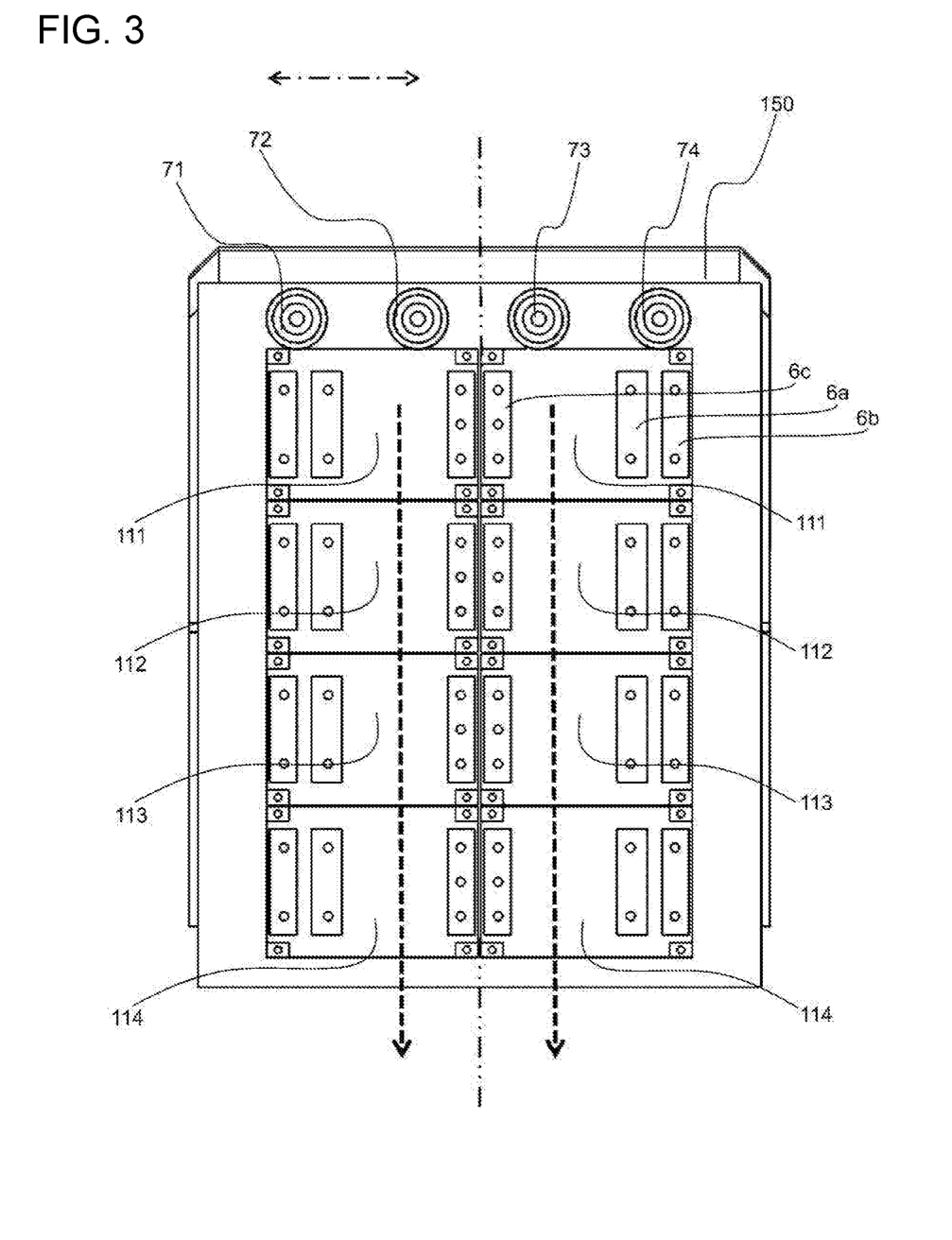
FIG. 3 is a front view in a state where bus bars are dismounted from the structure shown in FIG. 2.

FIG. 3 shows a front view in a state where the bus bars are dismounted from the structure shown in FIG. 2. The power module 110 shown in FIG. 4 is installed while coming into contact with the cooling equipment 150 in the arrangement of the array shown in FIG. 3. Namely, in order to realize high-density packaging, the power modules are configured as a four-line configuration (power modules 111 to 114) by allowing the module short-length direction 5 to coincide with the vertical direction (gravity direction), and are configured as a two-line configuration mirror symmetric with respect to the central axis (the alternate long and two short dashes line shown in FIG. 3) of the cooling equipment 150 by allowing the module longitudinal direction 4 to coincide with the travelling direction (the alternate long and short dash line with arrows shown in FIGS. 1 to 3 and 9 to 11) of the train.

As described above, the length of the power conversion device 100 in the travelling direction can be shortened by employing the above-described configuration, and the pressure loss of the cooling equipment 150 that performs cooling using travelling wind can be advantageously reduced. In addition, a control signal line (not shown) can be extracted from space between the module positive-electrode terminal 6a and the terminal 6c for inputting or outputting module AC or for a specific purpose in the direction of the arrow dashed lines shown in FIG. 3.

The power conversion device 100 is configured using, for example, a 2-in-1 power module 1 (111) in which a U-phase upper and lower arms series circuit is mounted, a 2-in-1 power module 2 (112) in which a V-phase upper and lower arms series circuit is mounted, a 2-in-1 power module 3 (113) in which a W-phase upper and lower arms series circuit is mounted, and a power module 4 (114) for a specific purpose to boost the contact line voltage. Hereinafter, the 2-in-1 power modules 111, 112, 113, and 114 of the respective phases will be simply referred to as power modules 110 when they are not especially distinguished from each other.

Figure 5:
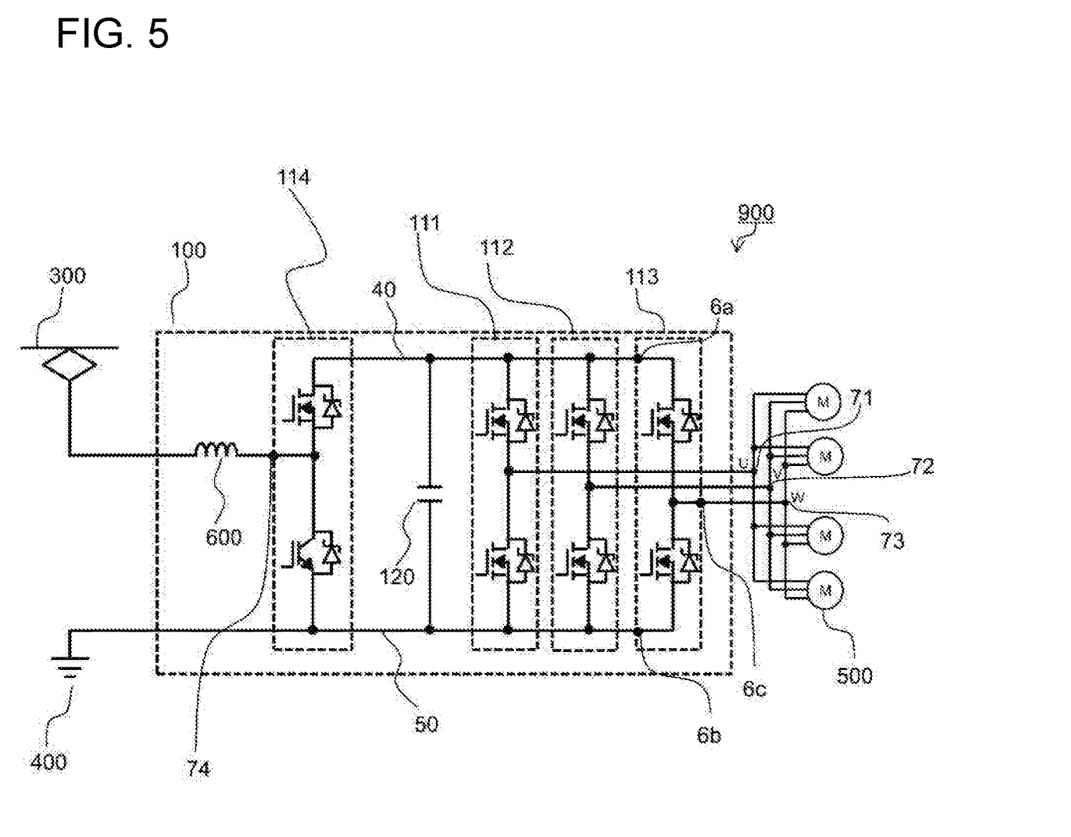
FIG. 5 is a diagram for showing a circuit configuration of a four-phase integrated power conversion device to realize a boosting circuit.

As shown in, for example, FIG. 5, each power module 110 has a half-bridge configuration in which an upper arm-side current switch circuit configured using a parallel connection circuit of an IGBT (Insulated Gate Bipolar Transistor) or a MOSFET (metal-oxide-semiconductor field-effect transistor) as semiconductor elements and a diode and a lower arm-side current switch circuit configured using the same parallel connection circuit are arranged in series.

Next, a four-phase integrated power conversion device to which specific functions can be added can be configured by applying and mounting the power conversion device 100 according to the first embodiment to an electric railroad vehicle 900. A concrete configuration example thereof will be described with reference to FIGS. 5 to 8. First, common constitutional elements will be described.

Figure 6:
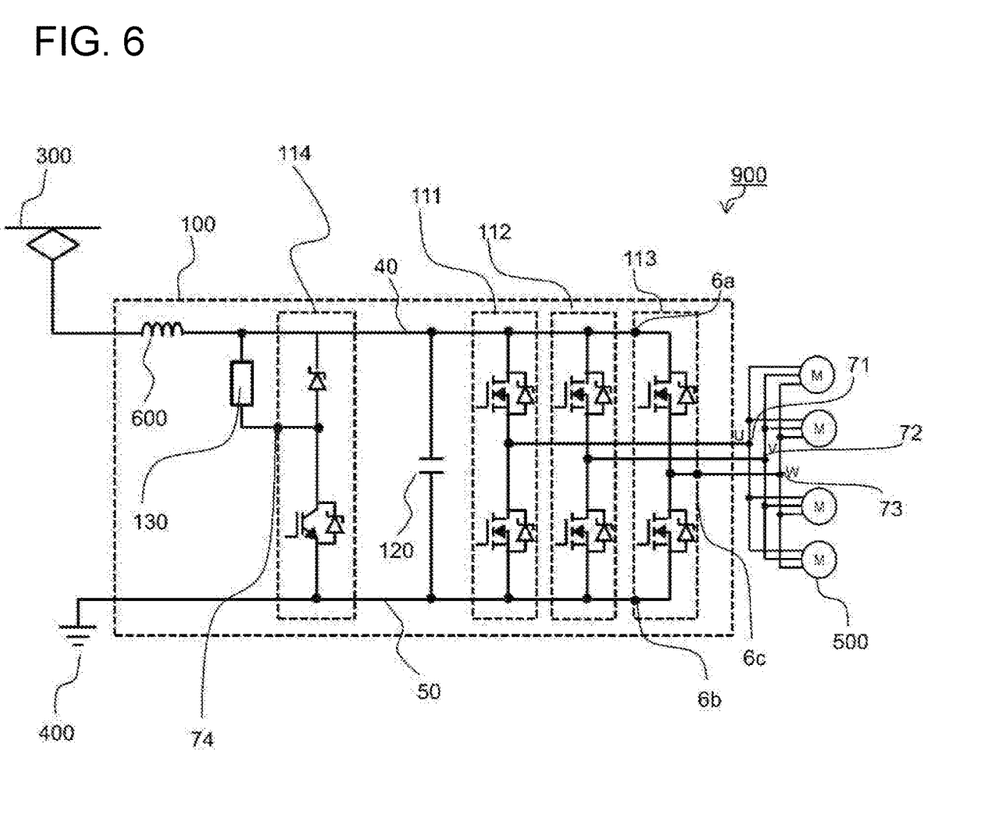
FIG. 6 is a diagram for showing a circuit configuration of a four-phase integrated power conversion device to realize an overvoltage suppression circuit.
Figure 7:
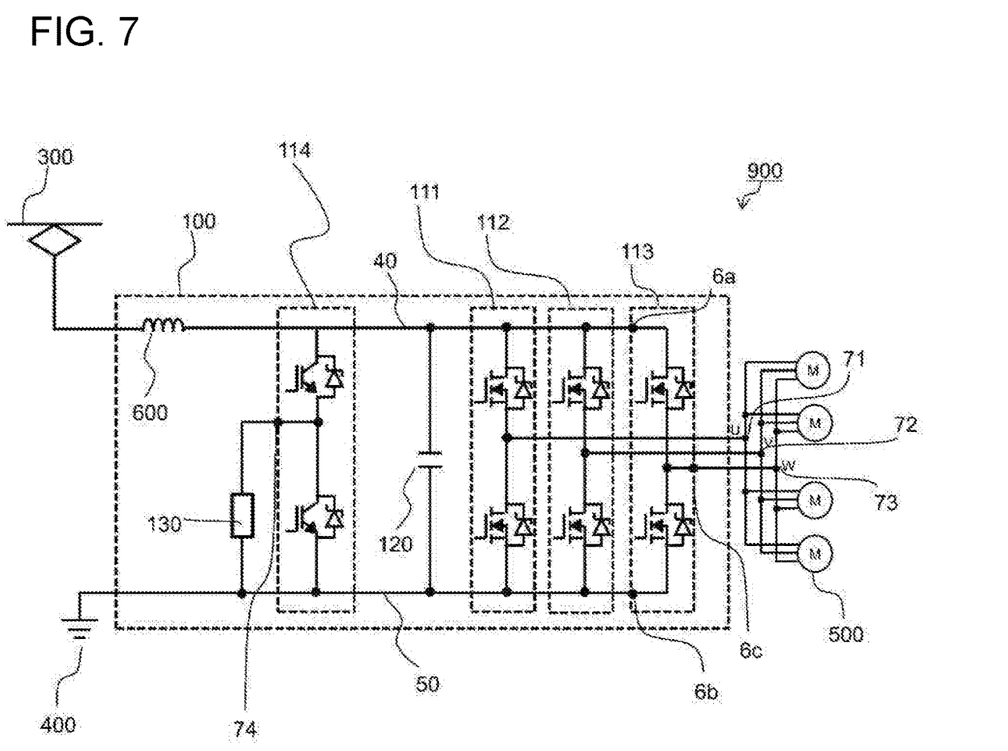
FIG. 7 is a diagram for showing a circuit configuration of a four-phase integrated power conversion device to realize a brake chopper circuit.
Figure 8:
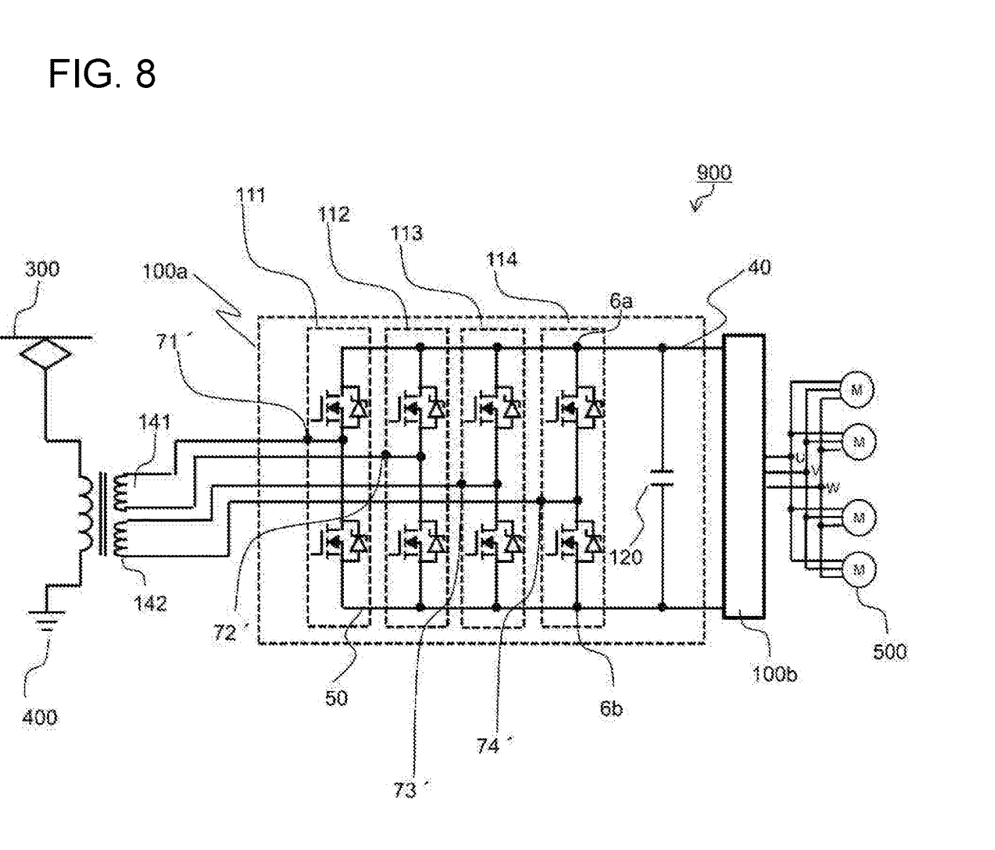
FIG. 8 is a diagram for showing a circuit configuration of a four-phase integrated power conversion device to realize a two-group two-phase converter circuit.

The power conversion device 100 functions as an inverter in FIGS. 5 to 7, and functions as a converter in FIG. 8. In the case of the inverter shown in FIGS. 5 to 7, a DC voltage applied between an overhead contact line 300 and a grounding part 400 is supplied to the power conversion device 100. For example, the DC voltage passing through a reactor 600 is input to a three-phase inverter configured using the 2-in-1 power module 1 (111) of the first phase, the 2-in-1 power module 2 (112) of the second phase, and the 2-in-1 power module 3 (113) of the third phase through the 2-in-1 power module 4 (114) and a capacitor 120 for a specific purpose. An AC voltage converted by the three-phase inverter is output from an output terminal 1 (71), an output terminal 2 (72), and an output terminal 3 (73) that are connected to the terminal 6c for inputting or outputting module AC or for a specific purpose of each power module, and drives a motor 500.

In addition, in the case of the converter (power conversion device 100a) shown in FIG. 8, an AC input voltage applied between the overhead contact line 300 and the grounding part 400 is supplied to a converter configured using the respective 2-in-1 power modules 1 to 4 (111 to 114) of the first to fourth phases through a first group-side transformer 141 and a second group-side transformer 142, and is converted to a DC voltage. The DC voltage converted by the converter is supplied to a power conversion device 100b configuring an inverter through the capacitor 120.

Next, individual configurations will be described.

FIG. 5 is a diagram for showing a circuit configuration of a four-phase integrated power conversion device to realize a boosting circuit. In addition, destinations to which terminals for outputting or for specific purposes are connected in the circuit configuration are shown in the following Table 1.

The 2-in-1 power module 1 (111) of the first phase, the 2-in-1 power module 2 (112) of the second phase, and the 2-in-1 power module 3 (113) of the third phase serve as power modules corresponding to the U phase, V phase, and W phase, and the output terminals 1 to 3 (71 to 73) connected to a module AC terminal 6c of each power module are connected to the U phase, V phase, and W phase of the motor 500, respectively.

In addition, the 2-in-1 power module 4 (114) of the fourth phase is connected to the DC side of the inverter for the boosting circuit as a specific purpose, and a terminal (74) for a specific purpose of the power module is connected to the reactor 600.

Namely, as shown in Table 1 (a column indicated as "FIG. 5"), regarding the terminal 6c for inputting or outputting module AC or for a specific purpose of each of the power modules 111 to 114, the first phase is connected to a U-phase motor wire of the output of the inverter as an output terminal, the second phase is connected to a V-phase motor wire of the output of the inverter as an output terminal, the third phase is connected to a W-phase motor wire of the output of the inverter as an output terminal, and the fourth phase is connected to a boosting wire of the inverter as a terminal for a specific purpose.

FIG. 6 is a diagram for showing a circuit configuration of a four-phase integrated power conversion device to realize an overvoltage suppression circuit. In addition, destinations to which terminals for outputting or for specific purposes are connected in the circuit configuration are shown in the following Table 1.

Since the 2-in-1 power modules 1 to 3 (111 to 113) of the first to third phases configure a three-phase inverter, the connection modes are the same as those shown in FIG. 5, and the fourth phase is different as a specific purpose. The 2-in-1 power module 4 (114) of the fourth phase is connected to the DC side of the inverter for overvoltage suppression as a specific purpose, and the terminal 4 (74) for a specific purpose of the power module 4 (114) is connected to the reactor 600 through a resistor 130.

Namely, as shown in Table 1 (a column indicated as "FIG. 6"), regarding the terminal 6c for inputting or outputting module AC or for a specific purpose of each of the power modules 111 to 114, the first phase is connected to the U-phase motor wire of the output of the inverter as an output terminal, the second phase is connected to the V-phase motor wire of the output of the inverter as an output terminal, the third phase is connected to the W-phase motor wire of the output of the inverter as an output terminal, and the fourth phase is connected to an inverter overvoltage suppression circuit wire on the DC side of the inverter as a terminal for a specific purpose.

FIG. 7 is a diagram for showing a circuit configuration of a four-phase integrated power conversion device to realize a brake chopper circuit. In addition, destinations to which terminals for outputting or for specific purposes are connected in the circuit configuration are shown in the following Table 1.

Since the 2-in-1 power modules 1 to 3 (111 to 113) of the first to third phases configure a three-phase inverter, the connection modes are the same as those shown in FIG. 5 and FIG. 6, and the fourth phase is different as a specific purpose. The 2-in-1 power module 4 (114) of the fourth phase is connected to the DC side of the inverter for a brake chopper as a specific purpose, and the terminal 4 (74) for a specific purpose of the power module 4 (114) is connected to the grounding part 400 through the resistor 130.

Namely, as shown in Table 1 (a column indicated as "FIG. 7"), regarding the terminal 6c for inputting or outputting module AC or for a specific purpose of each of the power modules 111 to 114, the first phase is connected to the U-phase motor wire of the output of the inverter as an output terminal, the second phase is connected to the V-phase motor wire of the output of the inverter as an output terminal, the third phase is connected to the W-phase motor wire of the output of the inverter as an output terminal, and the fourth phase is connected to a brake chopper wire on the DC side of the inverter as a terminal for a specific purpose.

FIG. 8 is a diagram for showing a circuit configuration of a four-phase integrated power conversion device to realize a two-group two-phase converter circuit. In addition, destinations to which input terminals are connected in the circuit configuration are shown in the following Table 1.

In the configuration shown in FIG. 8, the four-phase integrated power conversion device is applied for inputting AC of a two-group two-phase converter. Thus, the terminal 6c for inputting or outputting module AC or for a specific purpose of each of the power modules 111 to 114 is used as an input terminal in this case. Hereinafter, "″" is added only when the terminal 6c is used as an input terminal.

In the 2-in-1 power module 1 (111) of the first phase and the 2-in-1 power module 2 (112) of the second phase, input terminals 1″ and 2″ (71″ and 72″) are connected to the first group-side transformer 141. In addition, in the 2-in-1 power module 3 (113) of the third phase and the 2-in-1 power module 4 (114) of the fourth phase, input terminals 3″ and 4″ (73″ and 74″) are connected to the second group-side transformer 142. Accordingly, the two-group two-phase converter circuit is configured using the four 2-in-1 power modules 1 to 4 (111 to 114).

Namely, as shown in Table 1 (a column indicated as "FIG. 8"), regarding the terminal 6c for inputting or outputting module AC or for a specific purpose of each of the power modules 111 to 114, the first phase is connected to a first group U-phase wire of the converter as an input terminal, the second phase is connected to a first group V-phase wire of the converter as an input terminal, the third phase is connected to a second group U-phase wire of the converter as an input terminal, and the fourth phase is connected to a second group V-phase wire of the converter as an input terminal.

TABLE 1

| Power module | FIG. 5 | FIG. 6 | FIG. 7 | FIG. 8 |
|---|---|---|---|---|
| First phase | U-phase motor wire of output of inverter | U-phase motor wire of output of inverter | U-phase motor wire of output of inverter | First group U-phase wire of converter |

TABLE 1-continued

| Power module | FIG. 5 | FIG. 6 | FIG. 7 | FIG. 8 |
|---|---|---|---|---|
| Second phase | V-phase motor wire of output of inverter | V-phase motor wire of output of inverter | V-phase motor wire of output of inverter | First group V-phase wire of converter |
| Third phase | W-phase motor wire of output of inverter | W-phase motor wire of output of inverter | W-phase motor wire of output of inverter | Second group U-phase wire of converter |
| Fourth phase | Boosting wire on DC side of inverter | Overvoltage suppression wire on DC side of inverter | Brake chopper wire on DC side of inverter | Second group V-phase wire of converter |

In addition, the four-phase integrated power conversion device can be configured to have a set of an inverter and a converter including various functions by being applied to the inverter side and the converter side. This example is shown in FIG. 12.

Figure 12:
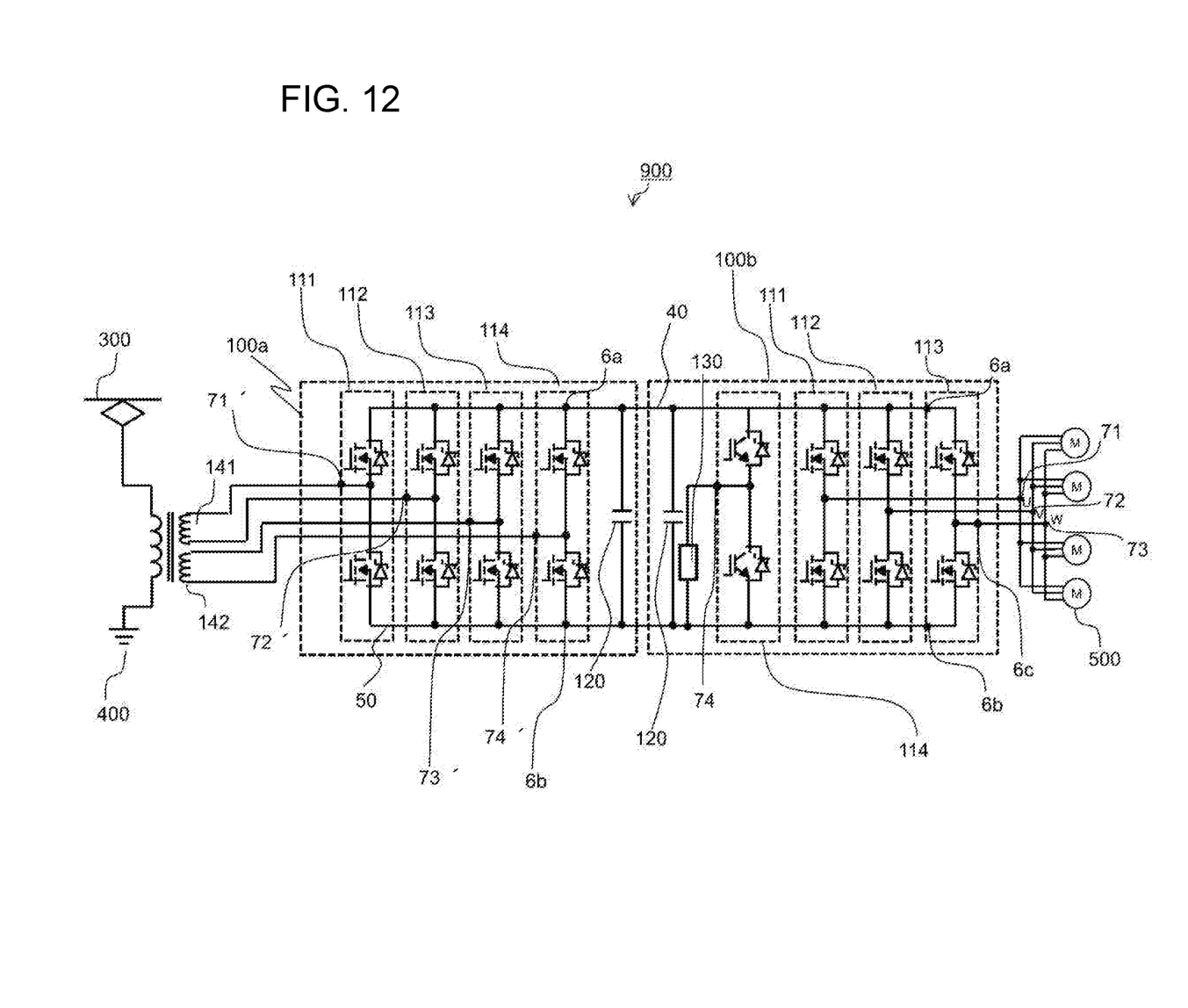
FIG. 12 is a diagram for showing an example of an electric railroad vehicle having a configuration in which an inverter including a brake chopper circuit shown in FIG. 7 and a two-group two-phase converter shown in FIG. 8 are combined with each other.

FIG. 12 is a diagram for showing an example of an electric railroad vehicle having a configuration in which an inverter 100b including the brake chopper circuit shown in FIG. 7 and a two-group two-phase converter 100a shown in FIG. 8 are combined with each other. It is obvious that the combination is not limited to the example shown in FIG. 12, and a combination of an inverter 100b including the boosting circuit shown in FIG. 5 and the two-group two-phase converter 100a shown in FIG. 8 or a combination of an inverter 100b including the overvoltage suppression circuit shown in FIG. 6 and the two-group two-phase converter 100a shown in FIG. 8 can be employed.

Namely, according to the present invention, any combinations of the above-described circuits have the same hardware configuration as a power conversion device to be used. Therefore, it is possible to realize a reduction in the number of parts for adjusting interfaces between the circuits and to improve the productivity of the power conversion device, leading to downsizing of the device and improvement of reliability as a result.

Second Embodiment

As the structure of the first embodiment shown in FIGS. 1 to 3, the bus bars for outputting or inputting or for specific purposes and the connection parts of the terminals 6c for inputting or outputting module AC or for specific purposes of the power module 110 are integrated in the central part of the power conversion device 100, and the capacitors 120 are distributed from side to side. In the structure of the first embodiment, the positive-electrode bus bar 40 and the negative-electrode bus bar 50 do not interfere with the central part of the power module 110, and thus there is an effect that a control signal line extracted from a control terminal (not shown) located in the middle of the module (a control signal line is lead to the direction indicated by the dashed arrows in FIGS. 2 and 3) is hardly affected by a magnetic field generated from the positive-electrode bus bar 40 and the negative-electrode bus bar 50. On the other hand, when the capacitors 120 are separated into two, there is a possibility that necessary electrostatic capacitance cannot be sufficiently secured.

A second embodiment of the present invention to be described next has a structure to solve the point.

Figure 9:
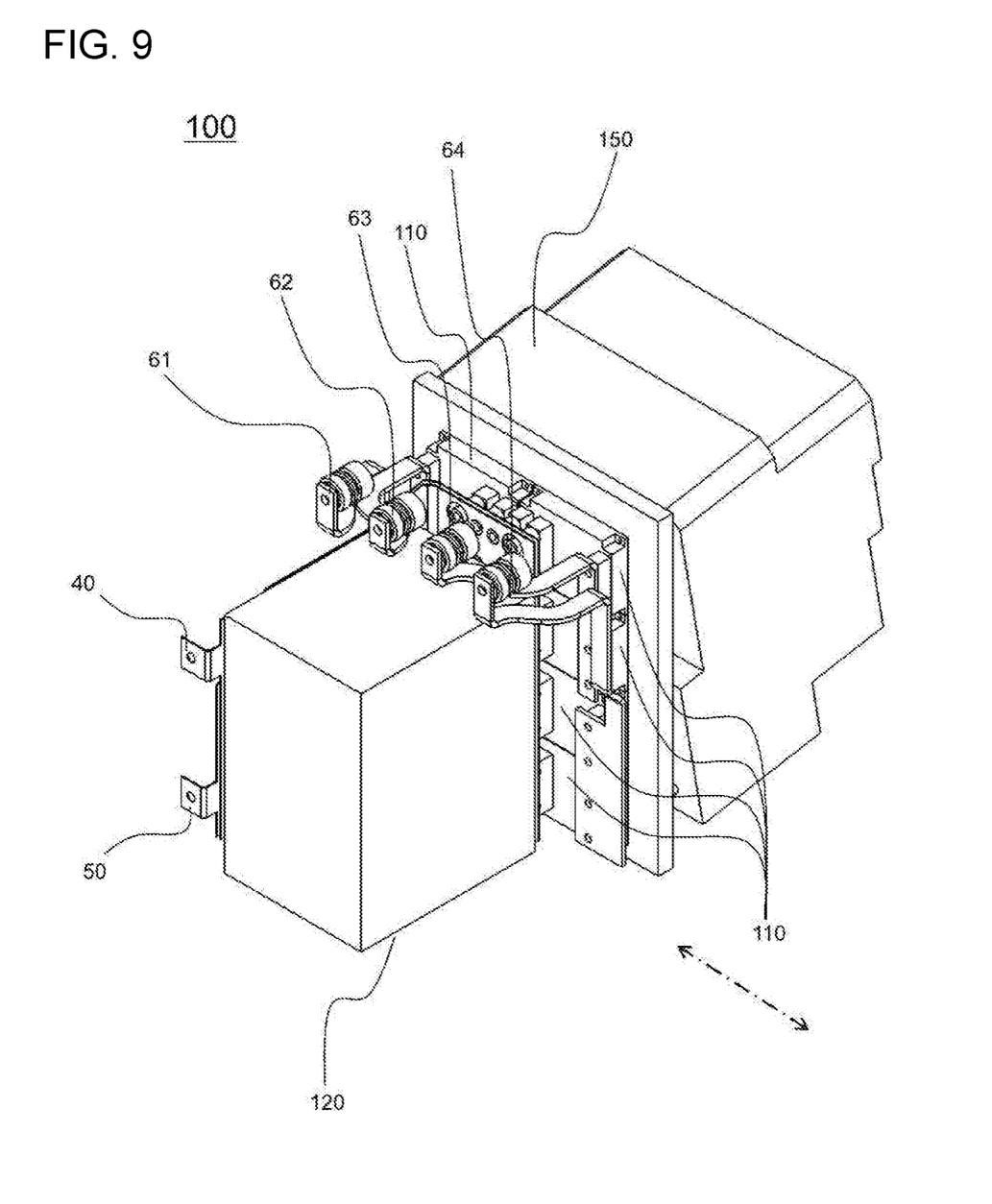
FIG. 9 is a diagram for showing a structure of a power conversion device according to a second embodiment of the present invention by using a perspective view.
Figure 10:
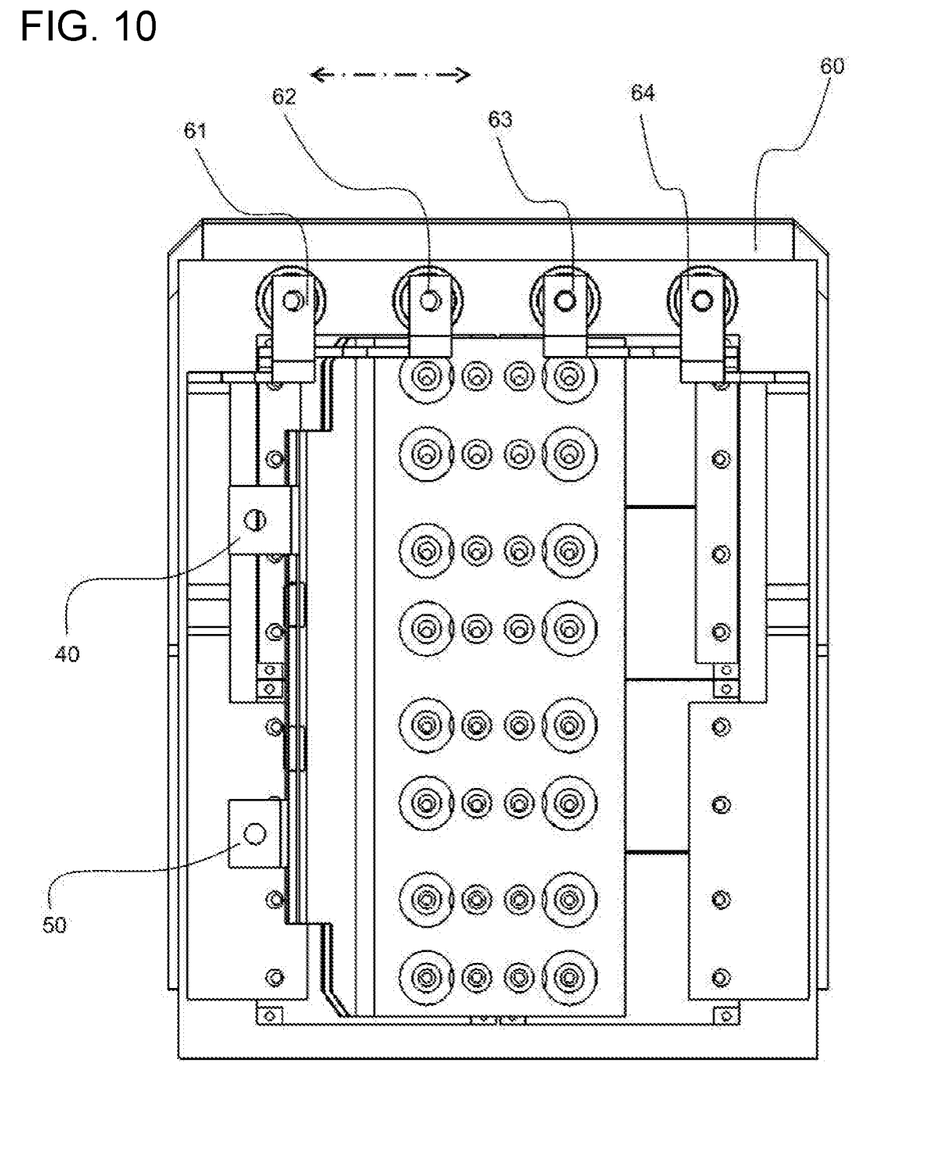
FIG. 10 is a front view in a state where only a capacitor is dismounted from the structure of the power conversion device shown in FIG. 9.
Figure 11:
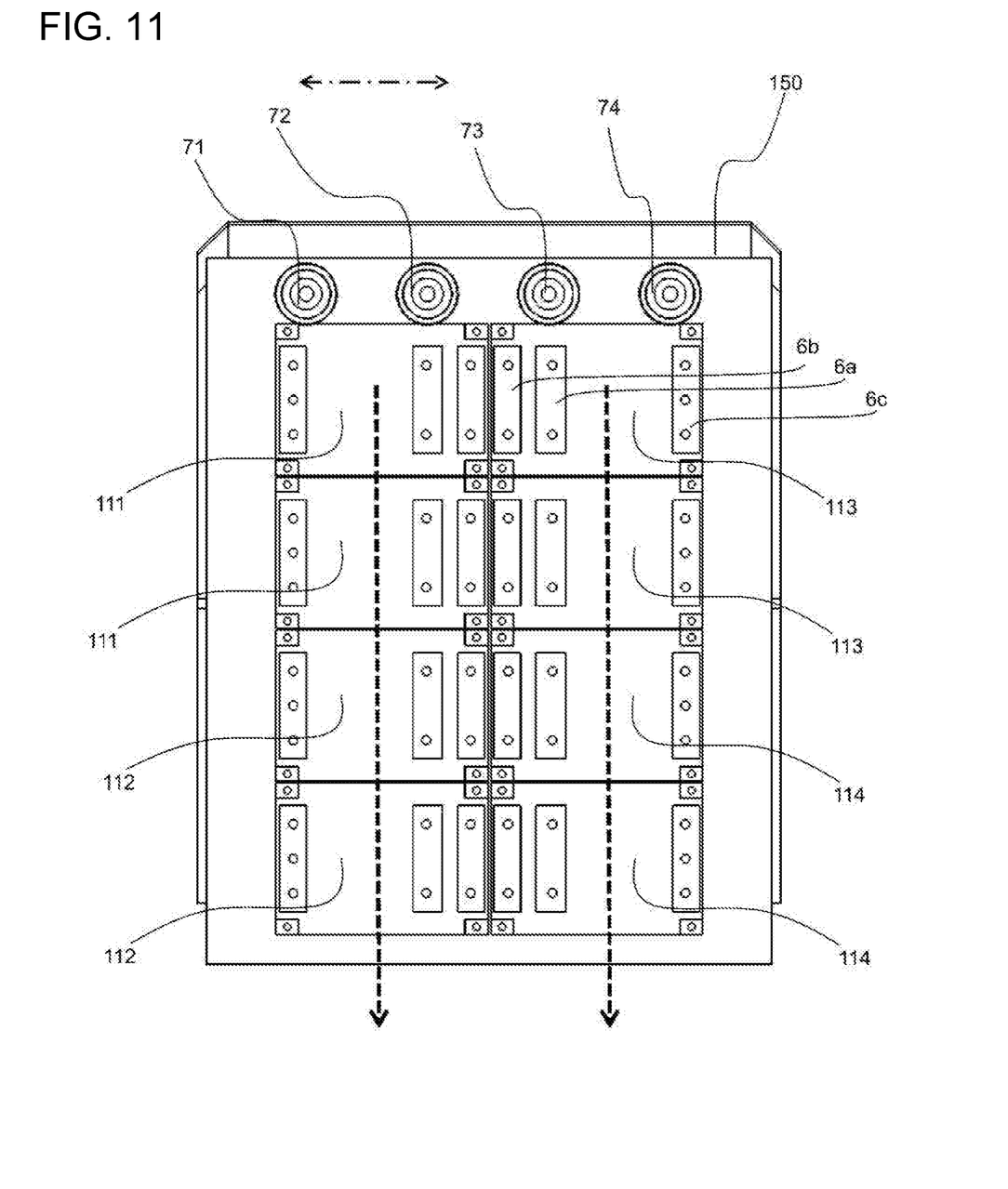
FIG. 11 is a front view in a state where bus bars are dismounted from the structure shown in FIG. 10.

A structure of a power conversion device 100 according to the second embodiment is shown in FIGS. 9 to 11. FIG. 9 is a diagram for showing a structure of the power conversion device 100 according to the second embodiment by using a perspective view. FIG. 10 shows a front view in a state where only the capacitor 120 is dismounted from the structure of the power conversion device 100 shown in FIG. 9, and FIG. 11 shows a front view in a state where the bus bars are dismounted from the structure shown in FIG. 10.

In the second embodiment, a single capacitor 120 is provided as shown in FIG. 9. Therefore, as shown in FIG. 11, an arrangement relation in which the entire power module 110 is aligned is the same as the case of the first embodiment shown in FIG. 3. However, the individual power modules 111 to 114 are arranged upside down, which is opposite to the case of the first embodiment, so that the terminals 6c for inputting or outputting module AC or for specific purposes are located at both ends of the power conversion device 100 (accordingly, the module positive-electrode terminals 6a and the module negative-electrode terminals 6b are located in the central part of the power conversion device 100). It should be noted that a control signal line (not shown) can be extracted from space between the module positive-electrode terminal 6a and the terminal 6c for inputting or outputting module AC or for a specific purpose in the direction of the arrow dashed lines shown in FIG. 11 as similar to the first embodiment. In addition, by arranging the module positive-electrode terminals 6a and the module negative-electrode terminals 6b as shown in FIG. 11, the positive-electrode bus bar 40 and the negative-electrode bus bar 50 are arranged on either end side of the power conversion device 100 in a plate shape in the vertical direction as shown in FIG. 10.

As described above, in the second embodiment, the connection parts of the terminals 6c for inputting or outputting module AC or for specific purposes of the power module 110 are integrated not in the central part but at both ends of the power conversion device 100 unlike the first embodiment, and the module positive-electrode terminals 6a and the module negative-electrode terminals 6b are provided in the central part of the power conversion device 100. Accordingly, since one large capacitor 120 can be connected to the bus bars, electrostatic capacitance can be largely secured, and a noise can be more effectively suppressed.

LIST OF REFERENCE SIGNS 4 module longitudinal direction
5 module short-length direction
6 module electric power terminal
6a module positive-electrode terminal
6b module negative-electrode terminal
6c terminal for inputting or outputting module AC or for specific purpose
40 positive-electrode bus bar
50 negative-electrode bus bar
60 bus bar for outputting or inputting or for specific purpose
61 bus bar for outputting or inputting 1
62 bus bar for outputting or inputting 2
63 bus bar for outputting or inputting 3
64 bus bar for specific purpose 4
70 terminal for outputting or for specific purpose
74 output terminal 1
72 output terminal 2
73 output terminal 3
74 terminal for specific purpose 4
70' input terminal 71' input terminal 1'
72' input terminal 2'
73' input terminal 3'
74' input terminal 4'
100 power conversion device
110 2-in-1 power module
111 2-in-1 power module 1 (first phase)
112 2-in-1 power module 2 (second phase)
113 2-in-1 power module 3 (third phase)
114 2-in-1 power module 4 (fourth phase)
120 capacitor
130 resistor
140 transformer
141 first group-side transformer
142 second group-side transformer
150 cooling equipment
200 breaker
300 overhead contact line
400 grounding part
500 motor
600 reactor
900 electric railroad vehicle

The invention claimed is:

1. A power conversion device configured using a semiconductor module having a half-bridge configuration in which two semiconductor elements are arranged in series,
wherein the semiconductor module has a substantially cuboidal shape, and forms one phase configuring the power conversion device by providing a positive-electrode terminal, a negative-electrode terminal, and a third terminal for inputting or outputting module AC or for a specific purpose along the longitudinal direction of the cuboid,
wherein the power conversion device has four phases formed by arranging the semiconductor modules in two lines mirror symmetric with respect to the horizontal direction that is the longitudinal direction of the cuboid and by arranging the same in four lines in the vertical direction that is the short-length direction of the cuboid, and the four phases are configured by adding a circuit for a specific purpose to a three-phase inverter as the remaining one phase or by using a two-phase two-group converter,
wherein cooling equipment is installed while coming into contact with all the semiconductor modules,
wherein one or more capacitors are arranged on the opposite side of the cooling equipment across all the semiconductor modules,
wherein a positive-electrode bus bar connected to the positive-electrode terminal of each of the semiconductor modules and a negative-electrode bus bar connected to the negative-electrode terminal of each of the semiconductor modules are connected to the capacitor, and
wherein each bus bar for outputting or inputting or for a specific purpose connected to the third terminal of each of the semiconductor modules is connected to an output terminal, an input terminal, or any one of four terminals for specific purposes corresponding to the four phases.

2. The power conversion device according to claim 1,
wherein the positive-electrode bus bar and the negative-electrode bus bar are arranged at both ends of the power conversion device in the horizontal direction while sandwiching the capacitor in the vertical direction or are arranged at one end of the power conversion device in the horizontal direction in parallel with the vertical direction of the capacitor.

3. The power conversion device according to claim 1,
wherein each of the bus bars for outputting or inputting or for specific purposes individually extends upward in the vertical direction, and is connected to any one of the four terminals.

4. The power conversion device according to claim 1,
wherein a control signal line is extracted from space between the positive-electrode terminal or the negative-electrode terminal and the third terminal.

5. The power conversion device according to claim 1,
wherein the circuit for a specific purpose is a boosting circuit.

6. The power conversion device according to claim 1,
wherein the circuit for a specific purpose is an overvoltage suppression circuit.

7. The power conversion device according to claim 1,
wherein the circuit for a specific purpose is a brake chopper circuit.

8. A power conversion device,
wherein an AC input is converted to an AC output by combining the power conversion device configured using the two-phase two-group converter according to claim 1 with the power conversion device in which the circuit for a specific purpose to be added as the remaining one phase to the three-phase inverter according to claim 1 is any one of a boosting circuit, an overvoltage suppression circuit, or a brake chopper circuit.

9. An electric railroad vehicle,
wherein the power conversion device according to claim 1 is mounted.

10. The electric railroad vehicle according to claim 9,
wherein the longitudinal direction of the semiconductor module configuring the power conversion device is set to the travelling direction of the vehicle.

* * * * *